(12) United States Patent
Shikami

(10) Patent No.: US 6,722,055 B2
(45) Date of Patent: Apr. 20, 2004

(54) SUPPORTING FIXTURE OF SUBSTRATE AND DRYING METHOD OF SUBSTRATE SURFACE USING THE SAME

(75) Inventor: Satoshi Shikami, Okayama (JP)

(73) Assignee: m·FSI Ltd., Tokyo (JP)

( * ) Notice: Subject to any disclaimer, the term of this patent is extended or adjusted under 35 U.S.C. 154(b) by 0 days.

(21) Appl. No.: 10/244,563

(22) Filed: Sep. 17, 2002

(65) Prior Publication Data

US 2003/0056391 A1 Mar. 27, 2003

(30) Foreign Application Priority Data

Sep. 18, 2001 (JP) ........................................ 2001-283885

(51) Int. Cl.[7] .................................................. F26B 3/00
(52) U.S. Cl. ............................. 34/329; 34/361; 34/406; 34/72; 34/92
(58) Field of Search ........................... 34/361, 362, 366, 34/406–412, 467–471, 73, 74, 76–78, 92, 239, 240, 107, 329; 414/935, 936, 939, 941

(56) References Cited

U.S. PATENT DOCUMENTS

| 5,105,556 A | * | 4/1992 | Kurokawa et al. ............. 34/470 |
| 5,115,576 A | * | 5/1992 | Roberson et al. ............. 34/402 |
| 5,174,045 A | * | 12/1992 | Thompson et al. ............. 34/58 |
| 5,436,721 A | * | 7/1995 | Pence et al. ................. 356/154 |
| 6,199,927 B1 | * | 3/2001 | Shamlou et al. ............. 294/64.1 |
| 6,244,641 B1 | * | 6/2001 | Szapucki et al. ............. 294/64.1 |

* cited by examiner

Primary Examiner—Henry Bennett
Assistant Examiner—Camtu Nguyen
(74) Attorney, Agent, or Firm—Oblon, Spivak, McClelland, Maier & Neustadt, P.C.

(57) ABSTRACT

A supporting apparatus for supporting a substrate in drying a substrate surface of the substrate including a supporting rod having a hollow interior portion and a groove configured to support a substrate on the supporting rod, the groove communicating to the hollow interior portion, a porous material disposed in the hollow interior portion of the supporting rod such that the porous material contacts with the substrate being supported in the groove, and a vacuum device configured to provide suction in the hollow interior portion of the supporting rod.

8 Claims, 7 Drawing Sheets

SUPPORTING FIXTURE OF SUBSTRATE AND DRYING METHOD OF SUBSTRATE SURFACE USING THE SAME

BACKGROUND OF THE INVENTION

1. Field of the Invention

The present invention relates to a drying method of a substrate surface and a supporting fixture of the substrate used in the drying method. More particularly, the invention relates to a drying method of the substrate surface, which permits achievement of a satisfactory dried state, even for the proximity of the contact portion of the substrate with a carrier holding section for holding and conveying the substrate, during the drying process carried out after a liquid treatment of a semiconductor wafer or a liquid crystal substrate, and a supporting fixture of the substrate using such a method.

2. Description of the Related Art

Conventional drying methods of a substrate surface after cleaning thereof in the manufacturing process of a semiconductor wafer or a liquid crystal substrate are broadly classified into the sheet-feed treating method and the batch treating method. The sheet-feed treating method mainly comprises the steps of rotating the substrate, removing water while flicking water from the substrate surface by use of the centrifugal force of rotation, and drying the same in a nitrogen atmosphere or a vacuum atmosphere. This method has, as compared with the batch treating method, problems of a low throughput (quantity of handled work per unit time), and easy occurrence of water mark (trace of evaporated water) on the substrate surface. To avoid these inconveniences, therefore, a batch-type drying treatment of the substrate surface is applied in many cases after cleaning through as dipping treatment of the substrate. For example, Chapter 6 of the "Present Status and Problems of Wafer Cleaning Technology" published by Realize Publishing Co., in May 2000 reports a batch-type drying method in combination with a dipping treating method which permits minimization of occurrence of water marks and adhesion of particles. As typical examples of the drying method, the above-mentioned article reports isopropyl alcohol (IPA) evaporation drying, direct substitution drying, Marangoni drying, and vacuum drying. In the above-mentioned methods, water drops on the substrate are dripped off by gravity for drying by relatively lowering the liquid level relative to the substrate having been dipped in the treatment liquid in the treatment vessel, although these methods use different kinds of drying gas.

In any of the aforementioned drying methods, a satisfactory dried state is available for the portion of the substrate surface distant from the substrate holding section of the carrier (hereinafter referred to as the "carrier holding section") for holding and conveying the substrate in the treatment vessel. However, defective drying occurs particularly at the contact portion of the substrate surface with the carrier holding section, and occurrence of water markers or adhesion of particles may sometimes be observed. The above-mentioned publication contains no description about occurrence of defective drying of the substrate surface near the carrier holding section for holding a semiconductor wafer or a liquid crystal substrate, or the necessity to prevent the same, and does not describe a method for solving such problems.

Typical examples of cleaning treatments of the substrate include etching, photoresist stripping and cleaning prior to diffusion. In any case, even when cleaning with a treatment solution is satisfactorily accomplished, occurrence of water marks or adhesion of particles, if any, in the drying treatment that follows causes a decrease in product yield. As a countermeasure against defective drying of the substrate surface tending to easily occur particularly near the carrier holding section described above, it is the common practice to exclude portions suffering from occurrence of water marks or adhesion of particles and thus to perfect commercial products by increasing edge-cut portions of the semiconductor wafer or the liquid crystal substrate, i.e., increasing rejected portions on the outer periphery of the substrate not perfected into commercial products. This causes a decrease in the number of available products per semiconductor wafer or liquid crystal substrate. It is also conceivable to improve draining and to reduce defective drying in the proximity of the carrier holding section by altering the cutting method of the fixing groove of the carrier holding section itself. Control is however difficult because of the difference in surface tension caused by the wafer surface condition.

For example, in the drying methods of a semiconductor substrate disclosed in Japanese Unexamined Patent Application Publications Nos. 1-226157, 3-62521 and 5-74921, it is proposed to dry the substrate surface by reducing the pressure of the entire treatment vessel. However, with this method of reducing the pressure of the entire treatment vessel alone, it is impossible to solve the problem of remaining liquid drops occurring near the carrier holding section of the substrate upon drying the substrate surface while lowering the liquid level. It is therefore inevitable to depend upon evaporation for removal of liquid drops remaining in this portion. This leads to the necessity of a long period of time for drying, resulting in occurrence of water marks. Furthermore, Japanese Unexamined Patent Application Publications Nos. 4-287321, 9-36082, and 10-41267 disclose apparatuses which dry a substrate surface by introducing nitrogen or IPA vapor in the treatment vessel under atmospheric pressure. These publications contain however no description of the problem of defective drying occurring near the carrier holding section of a substrate surface such as a semiconductor wafer surface, and hence nothing about a method for solving these problems.

SUMMARY OF THE INVENTION

An object of the present invention is therefore to provide a drying method of a substrate surface, which, in the drying performed after subjecting a semiconductor wafer or a liquid crystal substrate to a chemical dipping and/or water dipping, never causes defective drying of the substrate surface particularly near the carrier holding section, and a supporting fixture of the substrate used in this drying method.

Another object of the present invention is to provide a drying method of a substrate surface excellent in economic merits, which uses facilities conventionally used for drying as they are, and permits improvement of the substrate product yield only by making a simple improvement, and a simple supporting fixture used for such a method.

The aforementioned objects are achieved by the present invention as described below. More specifically, the invention provides a supporting fixture of a substrate used in a drying method of a substrate surface for drying the substrate surface, after subjecting the substrate to a chemical dipping treatment and/or a water dipping treatment, while causing relative descent of the treatment liquid level relative to the substrate, having a supporting rod of which at least the center portion is formed of a porous material; wherein a groove for supporting the substrate on the surface of the supporting rod is provided; the groove is configured so that, when supporting the substrate, the substrate comes into contact with the porous material; and a vacuum mechanism for converting the interior of the supporting rod into a vacuum state is provided.

Preferred embodiments of the above-mentioned supporting fixture of a substrate include a mechanism for purging pores in the portion made of the porous material with a desired gas and/or liquid. Another preferred embodiment is a supporting fixture of a substrate further comprising, together with the vacuum mechanism, a liquid trap vessel, having a vent valve and a drain valve, for trapping the liquid sucked by reducing the pressure. The preferred embodiments of the invention include a supporting fixture of a substrate, wherein the supporting rod has a double structure comprising a core made of a porous material and an outer edge surrounding the core, made of a material not porous; the outer edge comprises a quartz pipe not made porous; and the core comprises a quartz rod sintered to make the same porous. Still another embodiment is a supporting fixture of a substrate, wherein the supporting rod had a double structure comprising a core made of a porous material and an outer edge surrounding the core made of a material not made porous; the outer edge comprises a pipe made of a fluororesin; and the core comprises a fluororesin rod polymerized to make the same porous.

Further another embodiment of the present invention is a drying method of a substrate surface for drying the substrate surface after subjecting the substrate to a chemical dipping treatment and/or a water dipping treatment, while causing relative descent of the treatment liquid level relative to the substrate; comprising the steps of previously installing a supporting fixture of a substrate in a treatment vessel; transferring the substrate held by the carrier holding section onto the groove on the supporting rod surface of the supporting fixture; and drying the substrate surface in this state while reducing the pressure in the interior of the supporting rod.

DESCRIPTION OF THE PREFERRED EMBODIMENTS

The present inventors carried out extensive studies on the method of reducing defective drying of a substrate surface occurring near the carrier holding section for holding and conveying the substrate into a treatment vessel when subjecting the surface of a semiconductor wafer or a liquid crystal substrate having been dipped in a treatment vessel for a chemical dipping and/or water dipping to a drying treatment with a drying gas such as cold nitrogen or hot nitrogen, or IPA vapor containing IPA while relatively lowering the treatment liquid level. As a result, they discovered a method which, when relatively lowering the treatment liquid level relative to the substrate, permits forced and efficient suction in vacuum, by a simple operation, liquid drops remaining under the effect of surface tension or liquid drops remaining because of an insufficient distribution of the drying gas near the contact portion with the supporting and fixing portion of the substrate, and they thus developed the present invention.

Figure 7:
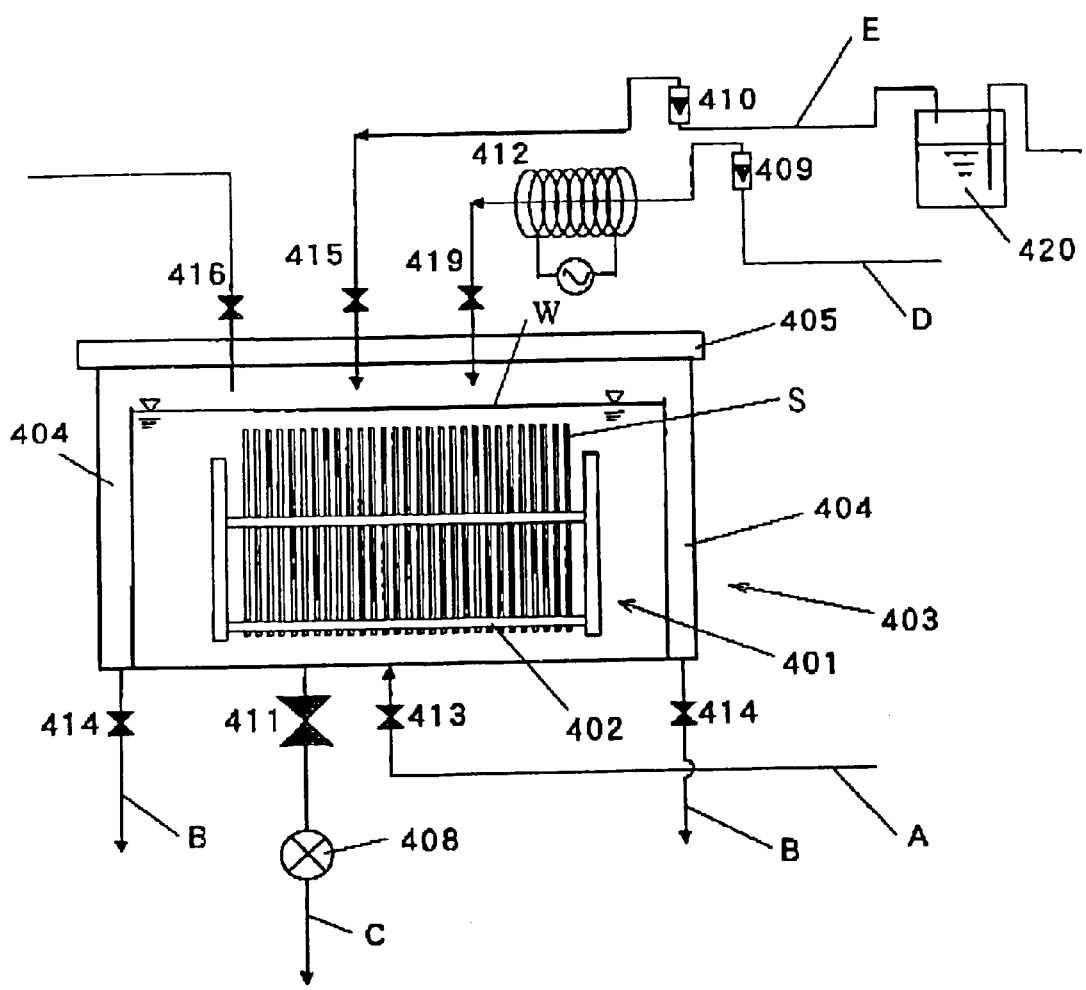
FIG. 7 is a schematic sectional view illustrating a configuration of the treatment vessel used in the drying method of a substrate surface in a conventional art.

For the purpose of cleaning the substrate surface of a semiconductor wafer or a liquid crystal substrate, it is the conventional practice to clean the substrate by immersing the substrate into a treatment solution in a treatment vessel as shown in FIG. 7. In FIG. 7, reference numeral 403 represents a treatment vessel, and a treatment solution A is introduced from a lower part of the treatment vessel via a treatment solution feed valve 413. When cleaning a substrate, the substrate S is conveyed into the treatment vessel 403 while being supported by a carrier holding section 402 of a carrier 401, immersed into the treatment solution in the treatment vessel, and cleaned. In the case shown in FIG. 7, the treatment solution is discharged from a drain valve 411 after cleaning, thereby completing the treatment by drying the substrate surface. More specifically, discharge of the treatment solution causes lowering of the liquid level W of the treatment solution, which in turn causes falling of liquid drops on the substrate surface by gravity, thus drying the substrate surface. In the above-mentioned case, the liquid level relative to the substrate is lowered by discharging the treatment solution from the treatment vessel. The present invention is not however limited to this practice, but any method for drying the substrate surface which relatively lowering the level of the treatment solution relative to the substrate may be adopted. For example, a drying method of relatively lowering the treatment solution level as compared with the substrate by slowly lifting up the substrate immersed in the treatment solution in the treatment vessel from the treatment solution can give advantages similar to those of the above-mentioned method discharging the treatment solution. The following description will cover the method of lowering the liquid level W relative to the substrate by discharging the treatment solution from the treatment vessel as an example of the drying method of the substrate surface.

In the above-mentioned drying process, as shown in FIG. 7, it is the usual practice to accelerate drying of the substrate surface by feeding a drying gas D or E to the treatment vessel from a drying nitrogen line 419 or an IPA vapor-containing nitrogen feeding line 415. In the drying stage, for example, if IPA vapor-containing nitrogen is supplied in a case where pure water is used as the treatment liquid, water remaining on the substrate surface is easily substituted by IPA having a high evaporation rate, thus making it possible to dry the substrate surface more rapidly. As described above, however, even in this case, the conventional drying method has problems in that defective drying such as occurrence of water marks or adhesion of particles is caused near the contact portion of the carrier holding section 402 by liquid drops remaining due to surface tension or drops of the treatment solution remaining as a result of insufficient distribution of the drying gas, thus causing a decrease in the product yield.

In the present invention, in contrast, upon cleaning as described above, it is tried to solve the problem of defective drying near the contact portion of the carrier holding section 402 which may be encountered during drying in the conventional art by transferring the substrate from the carrier holding section 402 having held the substrate in the treatment vessel to a supporting fixture of substrate having a configuration unique to the invention. In the invention, more particularly, a supporting fixture of substrate is used, which has a supporting rod of which at least the center portion is formed of a porous material; wherein a groove for supporting the substrate on the surface of the supporting rod is provided; the groove is configured so that, when supporting the substrate, the substrate comes into contact with the porous material; and a vacuum mechanism for converting the interior of the supporting rod into a vacuum state is provided. By supporting the substrate by the groove of the supporting rod forming such a supporting fixture of substrate, liquid drops remaining on the substrate surface, particularly near the contact portion of the carrier holding section 402 are easily absorbed by the porous material through contact with the porous material in a vacuum state, because the center portion of the supporting rod comprises the porous material and the groove formed on the supporting rod surface has a structure such that, when supporting the substrate, the substrate comes into contact with the porous material at the center portion of the supporting rod. As a result, it is possible to dry the substrate surface more rapidly and easily over the entire substrate surface.

As against the above-mentioned method, it is conceivable, in the conventional art, to form the center portion of the carrier holding section 402 forming the carrier 401 into a porous structure and to form a groove for supporting the substrate in a state similar to that described above. However, a conventionally used carrier is not preferable because of the necessity, when installing a vacuum mechanism, for a complicated structure including an attaching/detaching mechanism of piping, since the conventional carrier is used not only for supporting and conveying the substrate in the above-mentioned treatment vessel, but also for conveyance to and from the preceding and following processes and conveyance, in a multi-stage treatment, between a plurality of treatment vessels.

Figure 6:
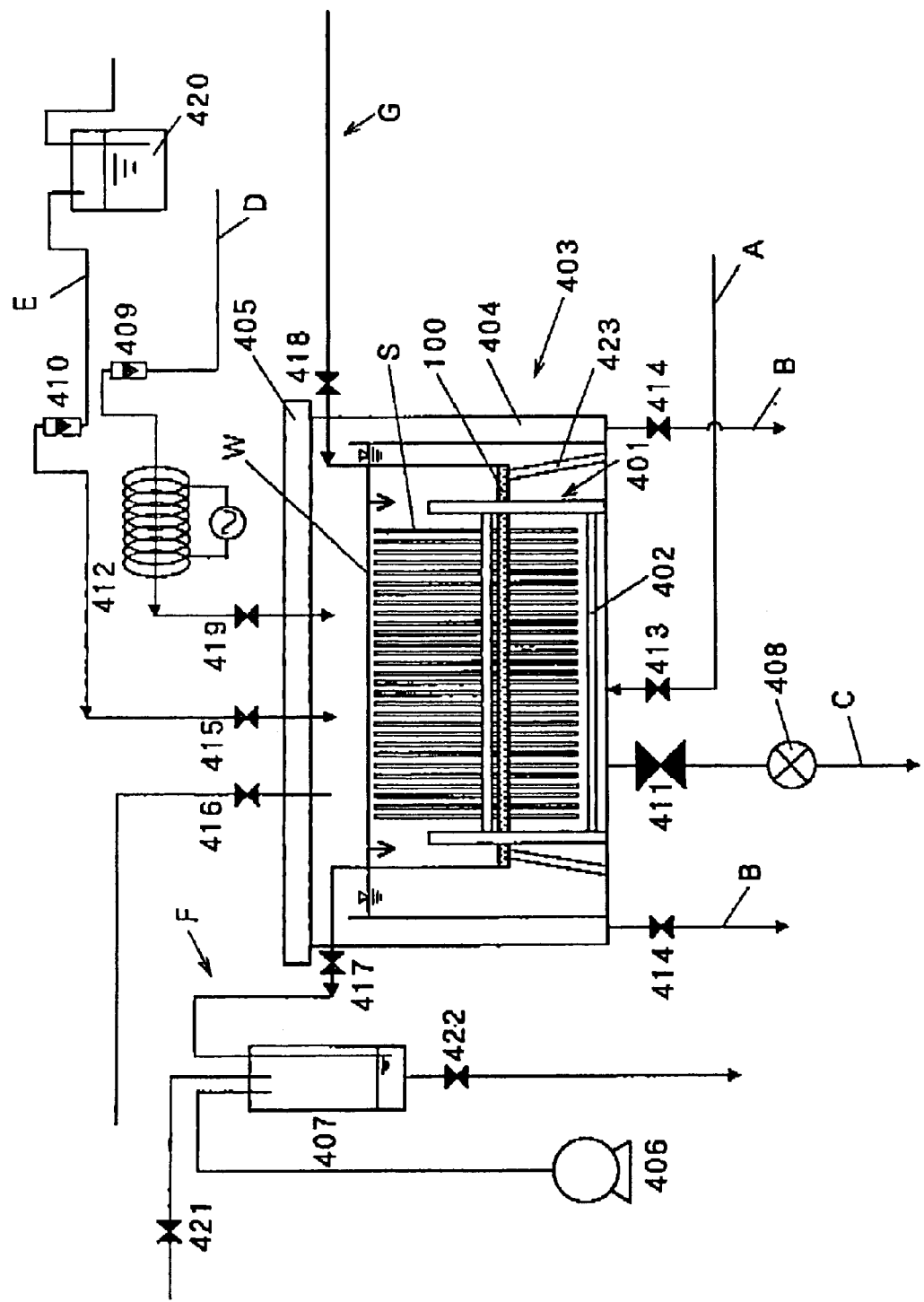
FIG. 6 is a schematic sectional view illustrating a configuration of the treatment apparatus used in the drying method of a substrate surface of the invention.

According to the configuration of the present invention, as shown in FIG. 6, during drying of the substrate, the substrate S such as a semiconductor wafer supported by a carrier 401 is taken out from the carrier holding section 402 and can be transferred to a supporting rod 100, previously provided in the treatment vessel 403, comprising a porous material at least at the center portion thereof. When providing a vacuum mechanism on the supporting rod 100, therefore, a complicated mechanism for attaching/detaching piping is never required (see line F in FIG. 6). As a result, it is possible to inhibit occurrence of particles accompanying a complicated piping mechanism. According to the present invention, drying is carried out by reducing the pressure in the porous material portion in the supporting rod 100. Polluting substances dissolved in the treatment vessel or particles floating in the solution therefore never flow back to the surface of the substrate S.

In another preferred embodiment of the supporting fixture of substrate of the present invention, a mechanism for purging the pores of the portion comprising a porous material in the interior of the supporting rod 100 with a desired gas and/or liquid is additionally provided, apart from the line F for reducing the pressure in the interior of the supporting rod 100. By providing a purge line G based on a gas or liquid such as nitrogen, it is possible to easily remove particles and the like trapped by the porous material in the interior of the supporting rod after drying. As a result, it is possible to use the fixture repeatedly in a satisfactory state in which re-adhesion of particles to the substrate is perfectly avoided. In still another embodiment of the supporting fixture of the invention, a liquid trap vessel for trapping the liquid sucked by reducing the pressure and discharging the same is provided simultaneously with the vacuum mechanism for the interior of the supporting rod. It is desirable to use a liquid trap vessel having a vent valve and a drain valve. In this configuration, as shown in FIG. 6, it is possible to trap water absorbed by the porous material of the center portion of the supporting rod 100 and sucked by the vacuum mechanism by means of a vacuum trap 407 having a vent valve 421 and a drain valve 422, and then discharge the same from the drain valve 422 of the vacuum trap. It is thus possible to prevent water described above from flowing into the vacuum pump 406.

Figure 4:
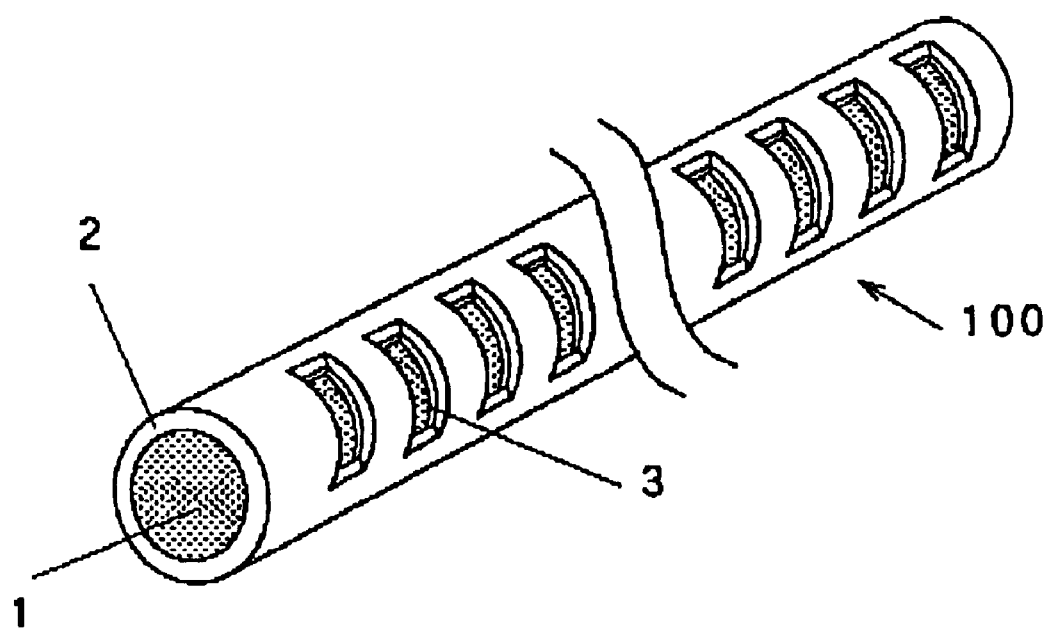
FIG. 4 is a perspective view schematically illustrating a configuration of the supporting rod serving as a component of the supporting fixture of substrate of the invention.

In the supporting fixture of substrate suitably used for the drying method of the present invention, it is desirable, when manufacturing the supporting rod forming the fixture, as shown in FIG. 4, to adopt a double structure having a core 1 comprising a porous material and an outer edge 2, not porous, surrounding the core, manufacture the outer edge 2 from a quartz pipe not made porous, and form the core 1 from a quartz rod sintered into a porous rod. The supporting rod 100 having such a configuration is suitably applicable when a wet treatment of a semiconductor wafer or a liquid crystal substrate in the treatment vessel before drying is carried out at a relatively high temperature, or when the solution is a highly oxidizing liquid such as ozone water. For the supporting rod of the above-mentioned configuration, more specifically, it is desirable to improve the adhesion between the core comprising the porous material and the pure quartz pipe forming the outer edge surrounding the core, by inserting the porous quartz rod having a high purity sintered so as to become porous into a pure quartz pipe having similarly a high purity not made porous to fit the inside diameter thereof, and then applying an annealing treatment.

In the supporting fixture of substrate suitably used for the drying method of the present invention, it is desirable, when manufacturing the supporting rod 100 forming the fixture, to adopt a double structure having a core 1 comprising a porous material and an outer edge 2, not porous, surrounding the core, manufacture the outer edge 2 from a fluororesin pipe not made porous, and form the core 1 from a fluororesin rod polymerized so as to become porous. The supporting rod having such a configuration is particularly suitably applicable when a wet treatment of a semiconductor wafer or a liquid crystal substrate in the treatment vessel before drying is carried out with a fluorine-containing liquid. The supporting rod having the above-mentioned configuration is obtained, more specifically, by forming the core from a porous rod comprising a fluororesin such as high-purity ethylene tetrafluoride (PTFE) polymerized so as to become porous, and inserting the thus formed core into a pipe made of a fluororesin such as pure tetrafluoroethylene-perfluoroalkylvinylether copolymer (PFA) to fit the inside diameter thereof. Preferably, by forming the supporting rod with the above-mentioned materials, and then applying a heating treatment, it is possible to improve the adhesion between the core made of the porous material and the pure fluororesin pipe forming the outer edge surrounding the core.

Figure 5:
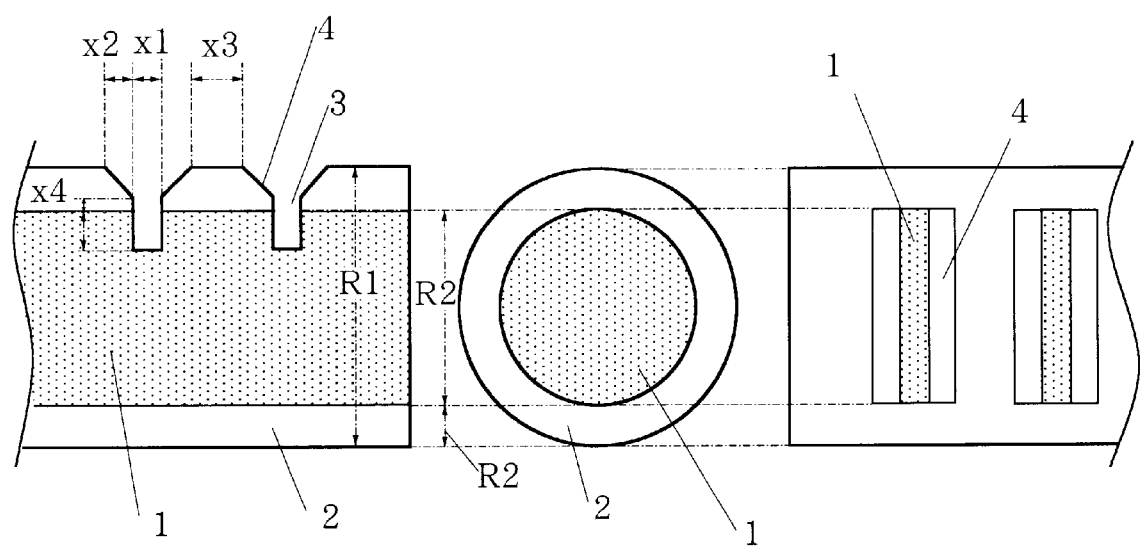
FIG. 5 is an exploded view for illustrating the shape of a groove on the supporting rod surface serving as a component of the supporting fixture of substrate of the invention used in an embodiment.

In addition, a groove 3 for supporting the substrate on the surface of the supporting rod 100 manufactured as described above is provided. As shown in FIGS. 4 and 5, the groove 3 is cut to a depth reaching the portion 1 made of the porous material of the core so that, when the substrate is supported by the groove on the supporting rod, the substrate comes into contact with the portion 1 comprising the porous material. As shown in FIG. 5, when the groove 3 thus formed has a shape of a taper 4 provided on the surface of the supporting rod, the end of the substrate can be smoothly guided into the groove 3 on the supporting rod 100 surface when supporting and fixing the substrate by only the supporting rod by transferring the substrate from the carrier holding section to the groove on the supporting rod surface.

The method for transferring the substrate from the carrier holding section 402 to the supporting rod 100 and supporting and fixing only by the supporting rod will now be described with reference to the drawings.

Figure 1:
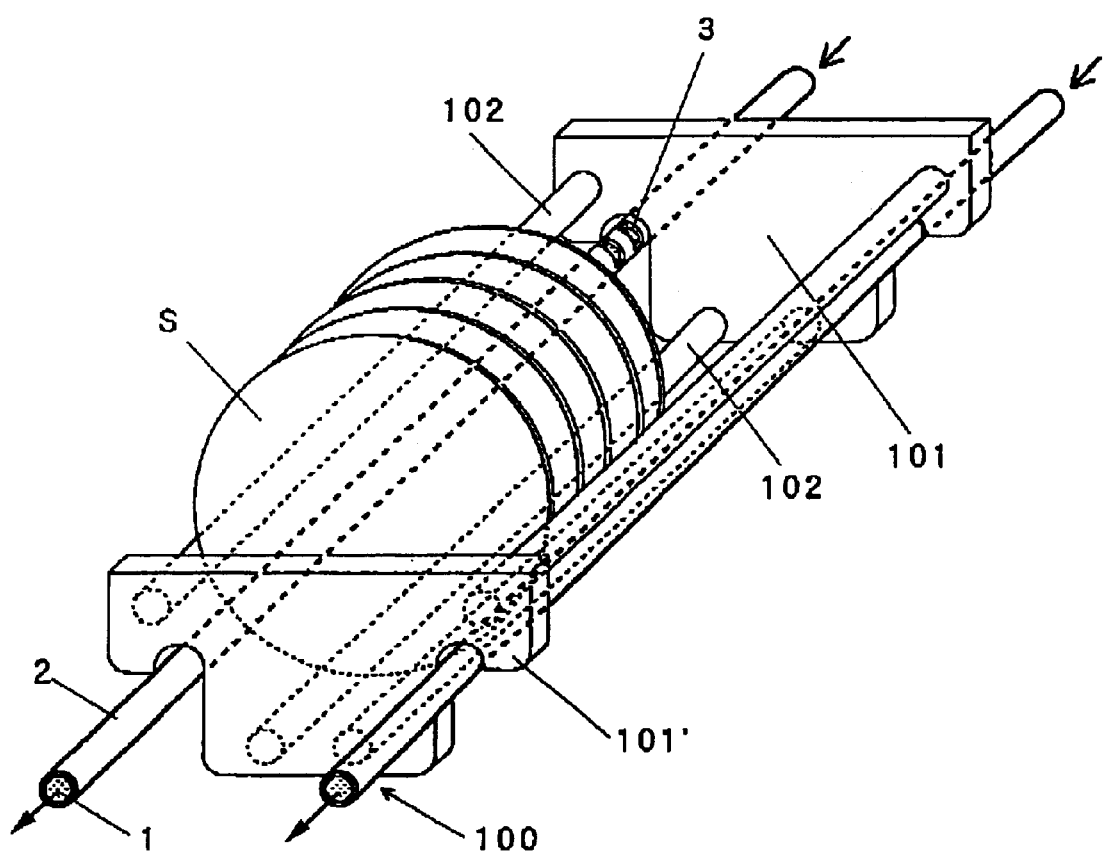
FIG. 1 is a perspective view schematically illustrating a state in the treatment vessel in which a substrate is supported by, and fixed to, the supporting fixture of a substrate of the present invention.
Figure 2:
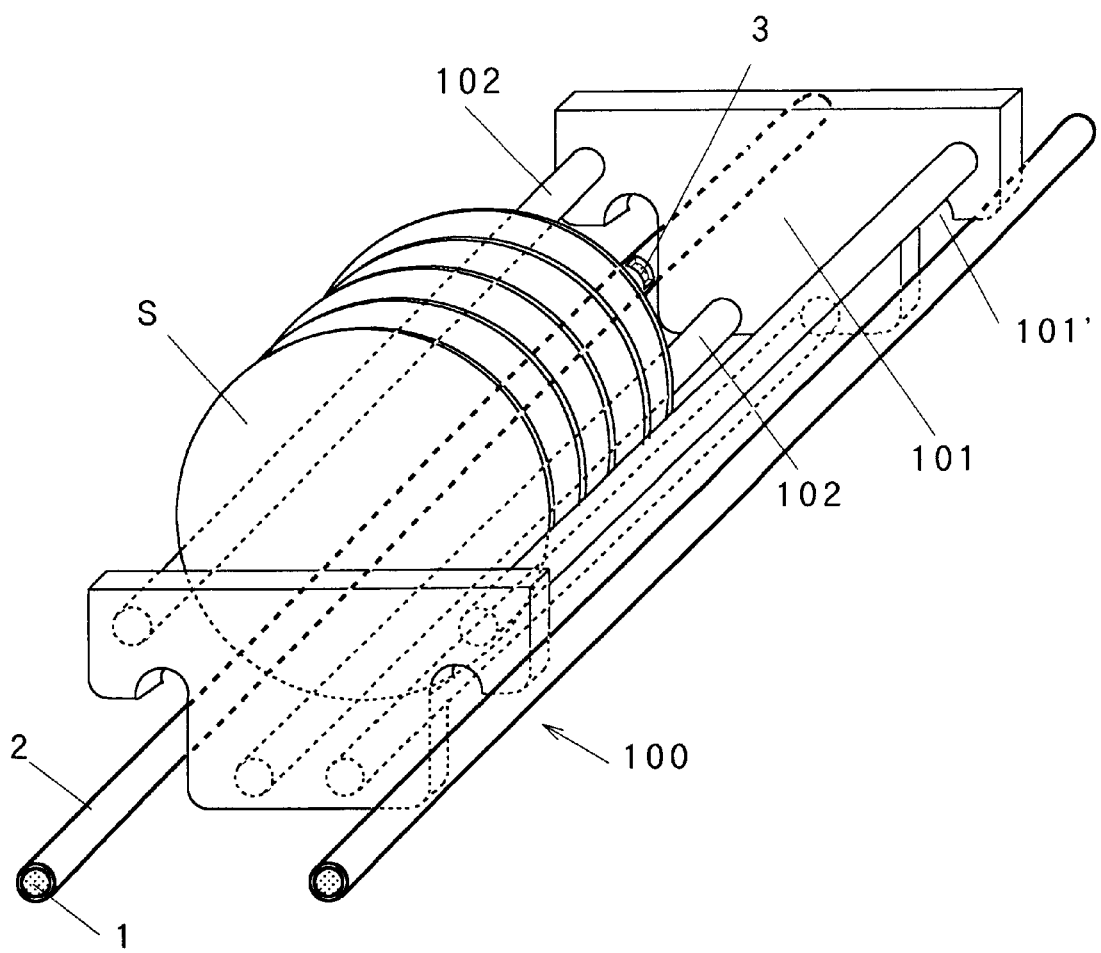
FIG. 2 is a perspective view schematically illustrating a substrate held by a carrier, and a state of the supporting fixture of a substrate of the invention in a similar situation.
Figure 3A:
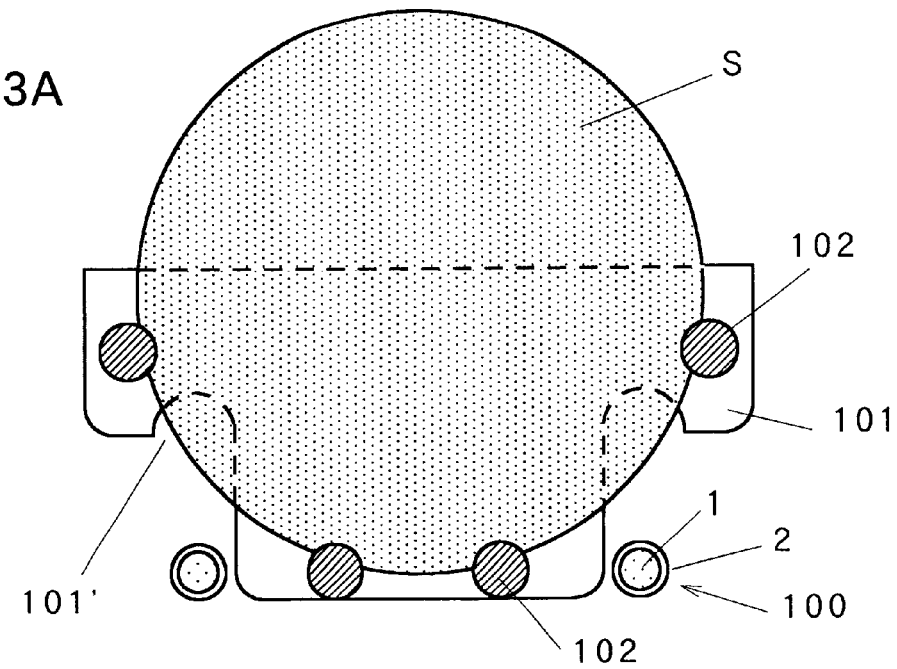
FIG. 3A is a sectional view illustrating the carrier holding a substrate.
Figure 3A:
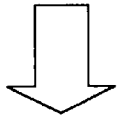

Cleaning of the substrate through a dipping treatment or the like is carried out, as shown in FIG. 7, by dipping the substrate S held by the carrier 401 into the treatment vessel 403 filled with a treatment solution such as a chemical solution or ultra-pure water. The subsequent drying is conducted by discharging the treatment solution in the treatment vessel 403 through the drain valve 411 provided at the lower part of the treatment vessel while lowering the liquid level W of the treatment solution. During the dipping treatment, the substrate S is held by a carrier holder 402 of the carrier 401. FIG. 2 is a schematic perspective view illustrating the state of the substrate S relative to the carrier 401 in this case. As shown in FIG. 2, in a state in which a plurality of substrates are held by the carrier holding section 102, the substrates, together with the carrier, are immersed in the treatment solution in the treatment vessel 403. The carrier holding section 102 supports the substrates at four positions including two upper and two lower pairs of positions so as to permit holding and conveyance as shown in FIG. 2. FIG. 3A illustrates the relationship between the substrate S and the carrier holding section 102 in this case.

The above-mentioned cleaning by dipping in the treatment solution is followed by drying of the substrate surface while relatively lowering the liquid level of the treatment solution as compared with the substrate. In the present invention, upon drying, the substrate S is transferred from the carrier holding section 102 to the groove provided on the surface of the supporting rod 100, and the substrate S is supported and fixed only by the supporting rod. This method will now be described. In the invention, as shown in FIG. 6, the supporting fixture 100 of substrate of the invention is previously arranged at a prescribed position in the treatment vessel 403. FIG. 3A illustrates the positional relationship of the substrate S, the carrier 101, and the carrier holding section 102, on the one hand, and the supporting rod 100, on the other hand, during dipping treatment of the substrate. As shown in FIG. 3A, the supporting rod 100 is present with no relationship with the substrate S or the carrier 101.

Figure 3B:
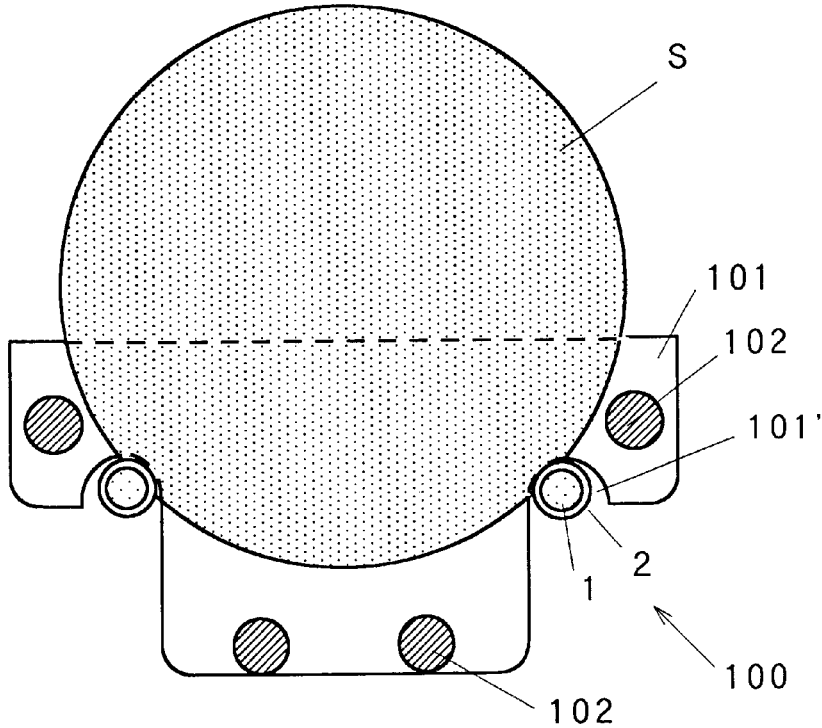
FIG. 3B is a sectional view illustrating a state in which a substrate is supported by, and fixed to, the supporting fixture of substrate of the invention.

Transfer of the above-mentioned substrate S from the state in which the substrate S is held by the carrier holding section 102 to the groove provided on the surface of the supporting rod 100 can be smoothly accomplished only by lowering the carrier 101 holding the substrate S in the treatment vessel 403, as shown in FIG. 6. More specifically, when lowering the carrier 101 from the state shown in FIG. 3A, the substrate S comes into contact with the supporting rod 100, and an end of the substrate S engages with the groove provided on the surface of the supporting rod 100. When further lowering the carrier from this state, the supporting rod 100 is caught by a notch 101' provided on the side wall of the carrier, and lowering is discontinued. As a result, as shown in FIG. 3B, the substrate S leaves the carrier holding section 102 in a state in which the substrate S is supported and fixed only by the two supporting rods 100. FIG. 6 is a schematic sectional view illustrating the interior of the treatment vessel in this state.

EXAMPLES

The present invention will now be described further in detail by means of examples and comparative examples. The present invention is not however limited by the examples or the comparative examples.

Example 1

A silicon wafer which was an 8-inch semiconductor wafer was used as an object of drying. In this example, a supporting rod 100 having the structure shown in FIG. 4 was used and installed at a prescribed position previously in a treatment vessel. The supporting rod 100 was formed by inserting a quartz rod 1 sintered to become porous having an outside diameter corresponding to the inside diameter of a pipe into the pure quartz pipe 2 not made porous. In addition, a groove 3 having a depth reaching the porous portion of the quartz rod 1 was formed on the surface of the supporting rod 100. FIG. 5 illustrates the shape of the supporting rod used in this example, having an outside diameter R1 of 10 mm, and the porous portion of the quartz rod 1 at the center had an outside diameter R2 of 7 mm. A groove 3 was cut at a pitch of 5 mm on the surface of the supporting rod. The groove had a tapered portion 4 as shown in FIG. 4, and the porous portion of the quartz rod 1 had a cut width x1 of 1 mm. The other portions included an x2 of 1 mm, an x3 of 2 mm, and an x4 of 2 mm.

The supporting rod having a plurality of grooves cut at a pitch of 5 mm having the above-mentioned shape was previously fixed at a desired position in the treatment vessel shown in FIG. 6. The grooves cut at a pitch of 5 mm on the surface of the supporting rod were provided so that the intervals agree with the grooves (not shown) provided in a conventionally used carrier holding section.

In this embodiment, substrates were conveyed into the treatment vessel by causing a conventional carrier to hold 25 semiconductor wafers, and introducing the carrier in this state into the treatment vessel. Upon executing this example, it was confirmed that, when the carrier was lowered from the position for cleaning down into the treatment vessel, 25 semiconductor wafers left the carrier and could be smoothly transferred to the supporting rod previously installed by the aforementioned procedure. It was confirmed that, as shown in FIG. 6, the carrier 401 itself was lowered into the treatment vessel 403 to reach the bottom thereof, all the 25 semiconductor wafers smoothly entered the grooves provided on the surfaces of the two supporting rods 100, and an end of each substrate S reached the porous portion at the center of the supporting rod 100. Then, the substrates were transferred again onto the carrier and subjected to a cleaning treatment with ultra-pure water and a drying treatment thereafter by the following procedure.

First, as shown in FIG. 7, the substrates S held by the carrier were arranged at cleaning positions in the treatment vessel 403. In this state, ultra-pure water was supplied from the bottom of the treatment vessel 403 by opening the ultra-pure water supply valve 413 for cleaning. In cleaning, supply of ultra-pure water was discontinued after confirming overflow from an overflow line 414. The overflow weir had a height of 300 mm from the bottom of the treatment vessel 403.

Then, the solution in the treatment vessel 403 was discharged through the drain valve 411 controlled by a mass flow controller 408 so that the lowering rate of the liquid level W of ultra-pure water became about 1 mm per second, while feeding nitrogen containing IPA vapor having a concentration of 1% serving as a drying gas E from an IPA vapor-containing nitrogen feeding line 415 shown in FIG. 6 at a flow rate of 10 l per minute. When, as a result of discharge of ultra-pure water under these conditions, the liquid level W in the treatment vessel became lower than the position of the supporting rod 100 arranged in the treatment vessel 403, a vacuum pump 406 was operated to actuate a vacuum mechanism provided in contact with an end of the supporting rod 100 so as to reduce the pressure in the supporting rod 100. In this operation, the vacuum line valve 417 was opened, the vent valve 421 of the vacuum trap 407 was closed, and the drain valve 422 of the vacuum trap 407 was closed. The pressure was reduced under conditions including an indication of 100 Torr of a vacuum gage installed in the pump. As a result, the pressure in the interior of the supporting rod 100 made of quartz having a center portion comprising a porous material was reduced so that water drops remaining near the contact portion of the substrate S and the supporting rod was sucked into the supporting rod 100.

Ultra-pure water in the treatment vessel was totally discharged and liquid drops on the substrate surface were sucked as described above. Then, drying nitrogen was injected as a drying gas D from a drying nitrogen line 419, heated to 60° C. by a heater 412, at a rate of 200 liters per minute for a period of 100 seconds. Thereafter, the heater 412 was turned off, and nitrogen was fed at room temperature from this line 419 for 20 seconds to purge the interior of the treatment vessel.

Comparative Example 1

For comparison purposes, a cleaning treatment and a subsequent drying treatment were performed in an apparatus in which no supporting rod is arranged in the treatment vessel, as shown in FIG. 7, as a typical conventional method. In this comparative example, 8-inch silicon wafers of the same kind and the same lot as in Example 1 were used as semiconductor wafers. While FIG. 7 illustrates a state in which the carrier 401 is not installed on the bottom of the treatment vessel 403, the treatments in this comparative example were conducted by arranging the carrier 401 with 25 semiconductor wafers S loaded thereon, grounded to the bottom in the treatment vessel 403. In this state, ultra-pure water was supplied from an ultra-pure water feeding valve 413, and after confirming overflow of the ultra-pure water from the overflow line 414, supply of pure water was discontinued. Subsequent discharge of ultra-pure water, supply of nitrogen containing IPA vapor at a concentration of 1%, and a treatment with heated drying nitrogen were carried out under the same conditions as in Example 1.
<Evaluation>

For the semiconductor wafers subjected to the treatments in the aforementioned Example 1 and the Comparative example 1, the number of particles adhering to the substrate surface was investigated to evaluate the states of cleaning and drying. The number of particles was measured, using a foreign matter inspection surf-scanner 6420 made by KLA Tencol Co., under a condition of edge cut of 3 mm, and the result was expressed by average values over 25 substrates. The result is shown in Table 1.

TABLE 1

Result of evaluation of Example 1 and Comparative Example 1

| | | PARTICLE SIZE ($\mu$m) | | | | | | | |
|---|---|---|---|---|---|---|---|---|---|
| | | 0.15 | 0.2 | 0.3 | 0.4 | 0.5 | 1 | 2 | 5 |
| NUMBER OF PARTICLE | EX. 1 | 2 | 1 | 1 | 2 | 0 | 0 | 0 | 0 |
| | COMP. 1 | 10 | 4 | 6 | 3 | 6 | 28 | 17 | 2 |

From Table 1, the possibility to manufacture dried wafers which can be evaluated to be substantially perfectly clear was confirmed in Example 1. In Comparative Example 1, in contrast, a number of particles adhering to the substrate surface were observed. Particularly, it was suggested that defective drying occurred on the edge of the substrate.

Example 2

As in Example 1, 25 8-inch silicon wafers which are semiconductor wafers were used as object of drying treatment. In this example, a resin supporting rod formed by inserting a PTFE rod polymerized into a porous state having an outside diameter corresponding to the inside diameter of a pipe into the pure-PFA pipe not made porous was used as the supporting rod 100. Under the other conditions as in Example 1, the silicon wafers were cleaned and dried.

Comparative Example 2

Silicon wafers were cleaned and dried in the same manner as in Comparative Example 1 except that 25 8-inch silicon wafers of the same kind and the same lot as those used in Example 2 were used as semiconductor wafers to be treated.
<Evaluation>

For the semiconductor wafers subjected to the treatments in aforementioned Example 2 and Comparative example 2, the number of particles adhering to the substrate surface was investigated to evaluate the state of cleaning and drying. The number of particles was measured by using a foreign matter inspection surf-scanner 6420 made by KLA Tencoll Co., under conditions including an edge cut of 3 mm, and the result was expressed by average values over 25 substrates. The result is shown in Table 2.

TABLE 2

Result of Evaluation of Example 2 and Comparative Example 2

| | | PARTICLE SIZE ($\mu$m) | | | | | | | |
|---|---|---|---|---|---|---|---|---|---|
| | | 0.15 | 0.2 | 0.3 | 0.4 | 0.5 | 1 | 2 | 5 |
| NUMBER OF PARTICLE | EX. 2 | 1 | 1 | 2 | 0 | 0 | 0 | 0 | 0 |
| | COMP. 2 | 6 | 3 | 2 | 1 | 5 | 20 | 15 | 1 |

According to the method of Example 2, as shown in Table 2, the possibility to manufacture of dried silicon wafers evaluated to be substantially completely clean was confirmed. In Comparative Example 2, in contrast, a number of particles adhering to the substrate surface were observed. Occurrence of defective drying on the edge of the substrate was suggested.

According to the present invention, as described above, there are provided a drying method of the substrate surface and a supporting fixture of substrate used for such a method which permits manufacture of a substantially perfectly clean substrates such as silicon wafers far more excellent than those available by the conventional method.

According to the present invention, a treatment vessel and other facilities used in the conventional method can be used as they are, with simple additional members, by a simple operation, and there are provided a drying method of a substrate surface and a supporting fixture used in such a method providing such excellent advantages.

What is claimed is:

1. A supporting apparatus for supporting a substrate in drying a substrate surface of the substrate, the supporting device comprising:

a supporting rod having a hollow interior portion and a groove configured to support a substrate on the supporting rod, the groove communicating to the hollow interior portion;

a porous material disposed in the hollow interior portion of the supporting rod such that the porous material contacts with the substrate being supported in the groove; and a vacuum device configured to provide suction in the hollow interior portion of said supporting rod.

2. A supporting apparatus according to claim 1, further comprising a purging device configured to purge pores of the porous material with at least one of a gas and liquid.

3. A supporting apparatus according to claim 1, further comprising a liquid trap vessel having a vent valve and a drain valve, and configured to trap liquid sucked into the supporting rod.

4. A supporting apparatus according to claim 1, wherein said supporting rod comprises a quartz pipe and the porous material comprising a quartz rod sintered to become porous.

5. A supporting apparatus according to claim 1, wherein said supporting rod comprises a fluororesin pipe and the porous material comprising a fluororesin rod polymerized to become porous.

6. A drying method of a substrate surface, comprising:

providing a treatment vessel having a supporting apparatus for supporting a substrate, the supporting device comprising a supporting rod having a hollow interior portion and a groove configured to support a substrate on the supporting rod, the groove communicating to the hollow interior portion, a porous material disposed in the hollow interior portion of the supporting rod such that the porous material contacts with the substrate being supported in the groove, and a vacuum device configured to provide suction in the hollow interior portion of the supporting rod;

transferring the substrate held by a carrier holding section onto the groove on the supporting rod; and drying the substrate surface while applying suction to the hollow interior portion of the supporting rod.

7. A drying method of a substrate according to claim 6, further comprising:

trapping liquid sucked by the supporting rod in a liquid trap vessel having a vent valve and a drain valve; and discharging the liquid from the liquid trap vessel.

8. A supporting apparatus for supporting substrates in drying substrate surfaces of the substrates, the supporting device comprising:

a plurality of supporting rods each having a hollow interior and a plurality of grooves configured to support substrates on the supporting rods, the plurality of grooves communicating to the hollow interior portion;

a porous material disposed in each of the hollow interior portions of the plurality of supporting rods such that the porous material contacts with the substrates being supported in the grooves; and a vacuum device configured to provide suction in the hollow interior portions of the plurality of supporting rods.

* * * * *